United States Patent [19]
Takeuchi

[11] Patent Number: 5,891,595
[45] Date of Patent: Apr. 6, 1999

[54] METHOD OF FABRICATING COMPOSITE PIEZO-ELECTRIC MEMBERS AND A MASK USED FOR THE FABRICATION OF THE SAME

[75] Inventor: Yasuhito Takeuchi, Tokyo, Japan

[73] Assignee: GE Yokogawa Medical Systems, Limited, Tokyo, Japan

[21] Appl. No.: 866,670

[22] Filed: Jun. 2, 1997

[30] Foreign Application Priority Data

Jun. 10, 1996 [JP] Japan ................................. 8-147248

[51] Int. Cl.$^6$ ....................................................... G03F 9/00
[52] U.S. Cl. ................................................. 430/5; 29/25.35
[58] Field of Search ............................. 430/5; 29/25.35; 310/311

[56] References Cited

U.S. PATENT DOCUMENTS

| 4,683,396 | 7/1987 | Takeuch et al. | 310/358 |
| 5,016,333 | 5/1991 | Payne et al. | 29/25.35 |
| 5,164,920 | 11/1992 | Bast et al. | 367/140 |
| 5,366,613 | 11/1994 | Suda et al. | 205/221 |

OTHER PUBLICATIONS

"Piezoelectric composites for micro–ultrasonic transducers realize with deep Etch X–ray lithography" Hirata et al, Pro.IEEE Micro–Electromechanical Systems, 1995, pp. 191–195.

"The Liga Process for fabrication of three–dimensional Microscale structures" P.Bley, Interdisciplinary Science REviews, 1933, vol. 18, No. 3, pp. 267–271.

*Primary Examiner*—S. Rosasco
*Attorney, Agent, or Firm*—Moonray Kojima

[57] ABSTRACT

Composite piezo-electric members having an intended structure are fabricated based on the LIGA process which includes the exposure of synchrotron radiation X-rays, development and lithography. With the intention of reducing the cost of the X-ray exposure mask, it is made of wire gauze having a regular pattern and formed by electrocasting.

17 Claims, 4 Drawing Sheets

WIRE GAUZE MASK PATTERN

WIRE GAUZE MASK PATTERN

METHOD OF FABRICATING COMPOSITE PIEZO-ELECTRIC MEMBERS AND A MASK USED FOR THE FABRICATION OF THE SAME

BACKGROUND OF THE INVENTION

1. Field of the Invention

The present invention relates to a method of fabricating composite piezo-electric members and a mask used for the fabrication of the same, and particularly to a method of fabricating composite piezo-electric members based on the exposure of synchrotron radiation (SR) X-rays, development and lithography, and to a mask used for the exposure of synchrotron radiation X-rays during the fabrication of composite piezo-electric members.

2. Description of the Related Art

There is known the LIGA (Lithographie Galvanoforming Abformung) process developed in the Karlsruhe Nuclear Research Center in Germany as a micro-fabrication technology for accomplishing three-dimensional microstructures having the thickness, besides the method based on the anisotropic etching of silicon.

The LIGA process is advantageous in that it can fabricate structures having such a large aspect ratio of several micrometers in width and several hundreds micrometers in thickness based on a unified lithographic treatment, it provides a smooth side surface of the fabricated structure, and it allows a wide choice of material including metals and resins.

Basically, as shown in FIG. 1, an X-ray mask (shown by 2) of a metallic film is made based on electron beam drawing in accordance with a mask pattern (shown by 1) designed by means of a CAD system. A PMMA resist material is exposed to the synchrotron radiation X-rays through the X-ray mask, and next it is rendered the development process, thereby forming a resist structure (shown by 3). Next, metal is deposited thickly in the recessed sections of the resist structure based on plating such as electrocasting, and the resist is removed, thereby forming a metallic structure, i.e., metallic mold (shown by 4).

For the small-scale production, the metallic mold is used directly for forming a final product (shown by 7). For the large-scale production, the metallic mold is used to form plastic molds (shown by 5), and the plastic molds are used to form metallic molds (shown by 6) to form final products (shown by 7).

Accordingly, the LIGA process enables the formation of a large number of products from a mold which is formed by a single exposure of synchrotron radiation X-rays.

The X-ray mask used for the LIGA process needs to be made from a thick metallic film due to a longer exposure time as compared with the X-ray lithography used in semiconductor fabrication. Specifically, metallic films used for the X-ray mask include an Au absorber (KfK) at a 15-$\mu$m pressure on a titanium foil of 2-$\mu$m thickness, or an Au absorber of a 5-$\mu$m thickness formed by electron beam drawing on a silicon thick film.

In making an X-ray mask, the pattern design based on the CAD system or the like for designing arbitrary mask patterns is required (shown by 1 in FIG. 1). In manufacturing an X-ray mask that is durable against the synchrotron radiation X-rays, the electron beam drawing equipment or CVD equipment is required.

These X-ray mask manufacturing facilities are expensive, and even if the X-ray mask is ordered from an external firm, each piece of mask will be considerably expensive.

SUMMARY OF THE INVENTION

Accordingly, it is an object of the present invention to provide a method of fabricating composite piezo-electric members having an intended structure based on the LIGA process, the method being capable of suppressing the cost of X-ray mask.

Another object of the present invention is to provide an X-ray exposure mask used for the fabrication of the composite piezo-electric members.

In a first aspect, the present invention resides in a method of fabricating composite piezo-electric members based on the exposure of synchrotron radiation X-rays, development and lithography, wherein the mask used for X-ray exposure is made of wire gauze.

This composite piezo-electric member fabricating method uses an X-ray mask of wire gauze in place of the conventional X-ray mask formed by the electron beam drawing equipment or CVD equipment in accordance with a mask pattern designed by means of a CAD system or the like. Particularly, in fabricating composite piezo-electric members of an intended structure, the inventive method does not need the pattern design based on a CAD system or the like, but employs a regular pattern of wire gauze. Accordingly, it eliminates the pattern design based on a CAD system or the like that is intended for the design of arbitrary mask patterns, and moreover it eliminates the need of the electron beam drawing equipment or CVD equipment in manufacturing the X-ray mask. Consequently, a considerable expenditure of the X-ray mask making facility can be saved.

In a second aspect, the present invention resides in a mask used for the fabrication of composite piezo-electric members based on the exposure of synchrotron radiation X-rays, development and lithography, wherein the mask of X-ray exposure is made of wire gauze.

The inventive X-ray exposure mask is a wire gauze, in place of the conventional X-ray mask formed by the electron beam drawing equipment or CVD equipment in accordance with a mask pattern designed by means of a CAD system or the like. Particularly, fabricating composite piezo-electric members of an intended structure does not need the pattern design based on a CAD system or the like, but it suffices to use a regular pattern of wire gauze. Accordingly, the inventive mask eliminates the pattern design based on a CAD system or the like that is intended for the design of arbitrary mask patterns, and moreover it eliminates the need of the electron beam drawing equipment or CVD equipment for manufacturing. Consequently, a considerable expenditure of the X-ray mask making facility can be saved.

In a third aspect, the present invention resides in an X-ray exposure mask, which is derived from the wire gauze mask of the second aspect, used for the fabrication of composite piezo-electric members, wherein the wire gauze has a mesh intended for the fabrication of 3–1 bonding composite piezo-electric members or 1–3 bonding composite piezo-electric members.

In a fourth aspect, the present invention resides in an X-ray exposure mask, which is derived from the wire gauze mask of the second or third aspect, used for the fabrication of composite piezo-electric members, wherein the wire gauze is formed by electrocasting.

It is possible for the wire gauze mask formed by electrocasting to accomplish a mask pitch as small as 5 $\mu$m and a gauze wire thickness as small as 2 $\mu$m.

It is possible for the LIGA process to accomplish a thickness and pitch of rods of the final product as small as 50 μm. It is possible to accomplish stably a height (thickness) of the final product down to about 500 μm based on the exposure of synchrotron radiation X-rays.

Accordingly, the composite piezo-electric member fabricating method based on the inventive mask is capable of fabricating composite piezo-electric members having a pitch from 5 to 50 μm and a height (thickness) of around 500 μm.

Further objects and advantages of the present invention will be apparent from the following description of the preferred embodiments of the invention as illustrated in accompanying drawings.

DESCRIPTION OF THE PREFERRED EMBODIMENTS

Figure 1:
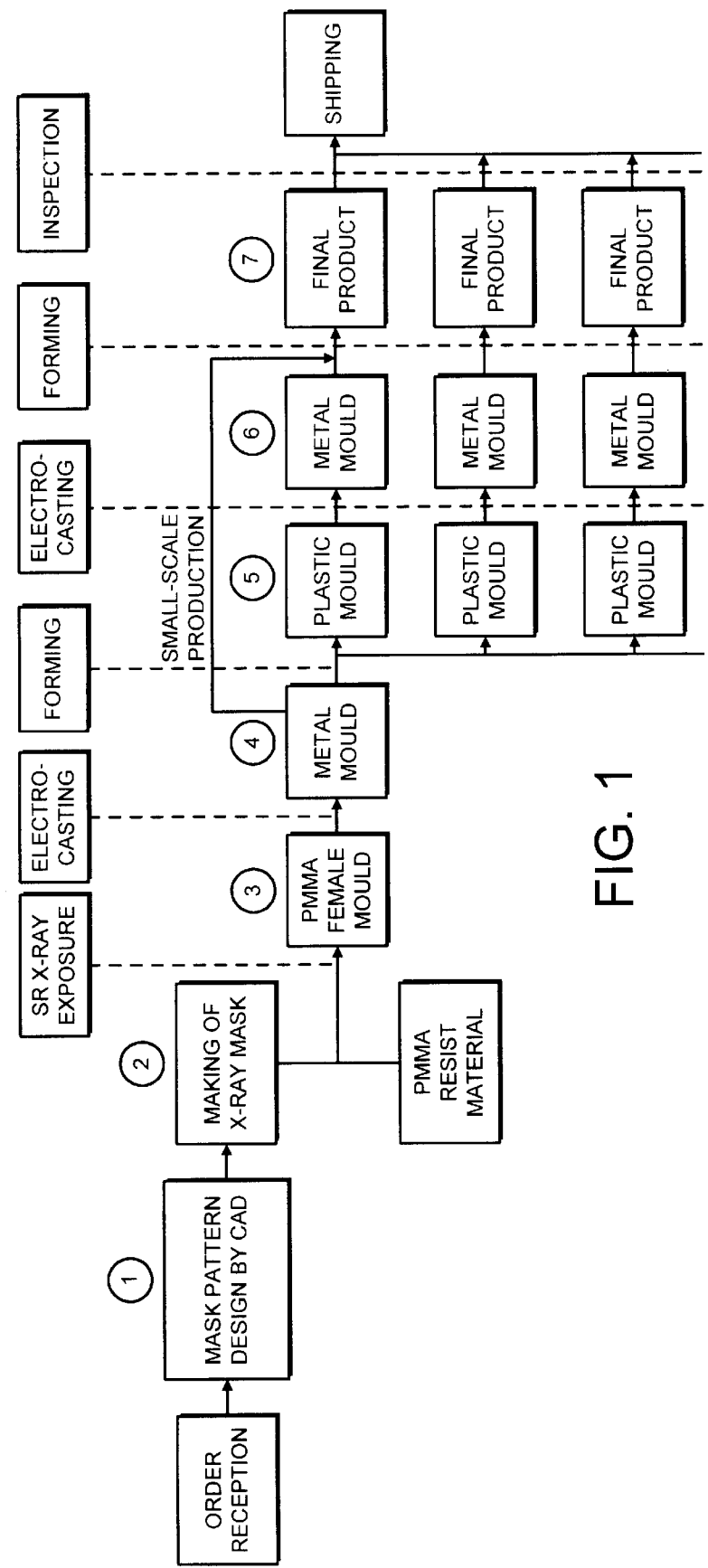
FIG. 1 is a diagram showing the sequential processes of the conventional composite piezo-electric member fabrication method.
Figure 2:
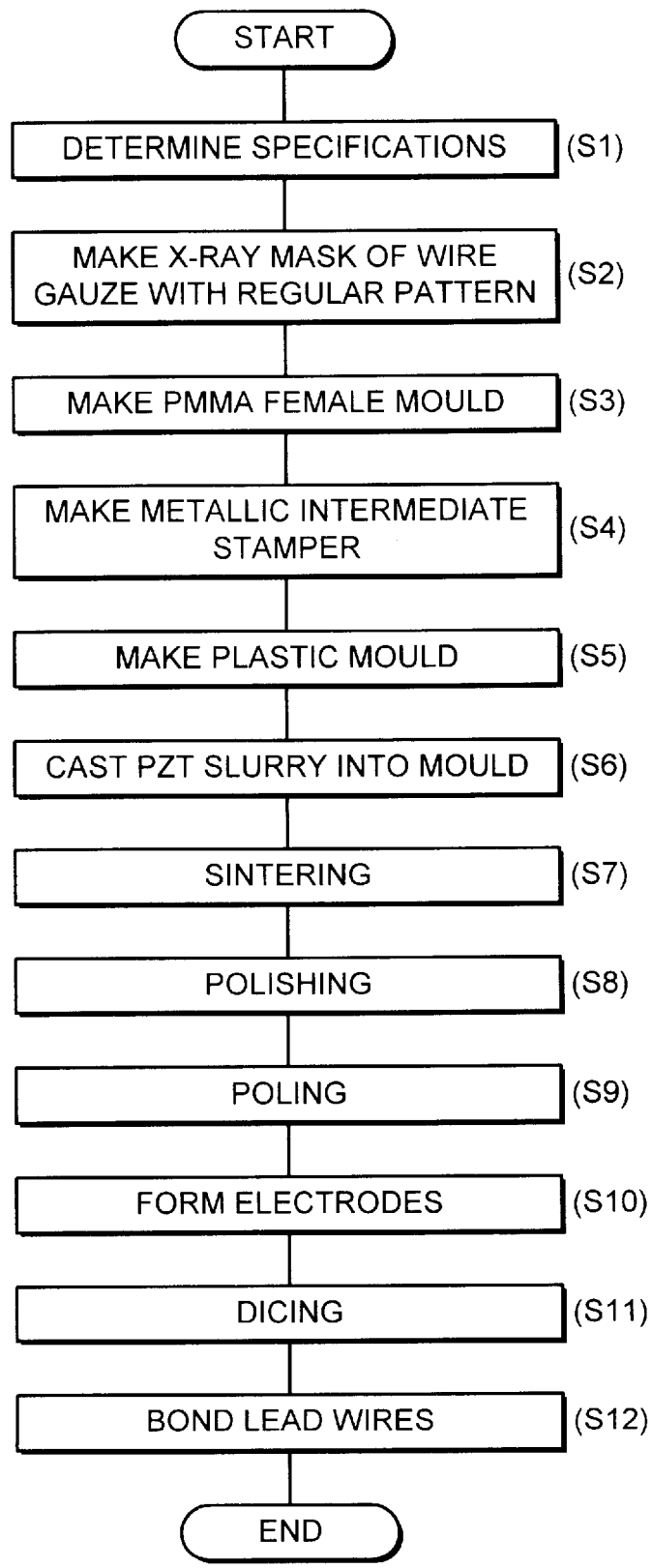
FIG. 2 is a flowchart showing the sequential processes of the composite piezo-electric member fabrication method based on an embodiment of this invention.
Figure 3:
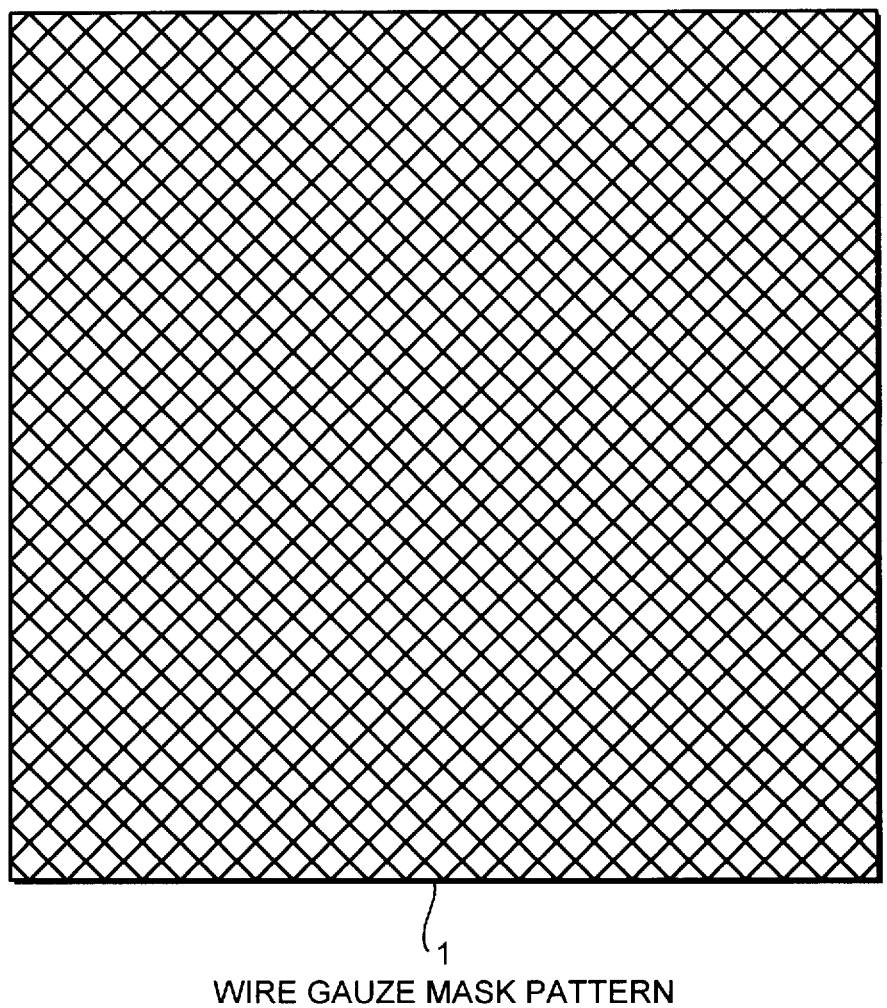
FIG. 3 is a diagram showing a fundamental pattern of the mask used to fabricate composite piezo-electric members based on an embodiment of this invention.

FIG. 2 is a flowchart showing the sequential processes of the composite piezo-electric member fabrication method based on an embodiment of this invention, and FIG. 3 is a diagram explaining the pattern of the X-ray mask used for the fabrication of composite piezo-electric members based on an embodiment of this invention.

Arrangement of the mask used for fabricating composite piezo-electric members

The arrangement of the mask used for fabricating composite piezo-electric members will first be explained with reference to FIG. 3. In the figure, the mask 1 is a gauze of metallic wires intersecting at virtually right angles formed by electrocasting or interlacing.

This wire gauze mask, in case it is formed by electrocasting, can have a wire pitch as small as 5 μm and a gauze wire thickness as small as 2 μm. It is desirable for the wire gauze mask formed by interlacing to have these dimensions comparable to those of the electrocasted mask.

The wire gauze is preferably made of platinum and, in case it is formed by electrocasting, a mask with a thickness from 5 to 7 μm is suitable for the LIGA process using synchrotron radiation X-rays. Other materials applicable to the mask for the fabrication of composite piezo-electric members include copper and nickel, in which cases masks used for the exposure of synchrotron radiation X-rays need to have a thickness from 20 to 25 μm. Masks of this thickness range can be made by electrocasting.

An interlaced wire gauze has its height (thickness) depending on the thickness of the metallic wire used, whereas an electrocast wire gauze can have independent dimensions of the wire thickness and the height of gauze.

It should be noted that the wire gauze mask used for the fabrication of composite piezo-electric members based on this embodiment is a simple wire gauze, rather than the conventional X-ray mask (formed of a metallic film such as an Au absorber (KfK) formed on a titanium foil, or an Au absorber of 5 μm in thickness drawn on a silicon thin film by the electron beam).

Fabrication processes of composite piezo-electric members

The sequential fabrication processes of composite piezo-electric members will be explained with reference to the flowchart of FIG. 2 and the diagrams of FIG. 4.

Initially, the specifications of the composite piezo-electric members to be fabricated is determined: (step S1 in FIG. 2). The fabrication of 1–3 bonding composite piezo-electric members or 3–1 bonding composite piezo-electric members is assumed in the following explanation.

In order to obtain finally rods of a constant size for the piezo-electric members of this type, a wire gauze mask having a uniform mesh as shown in FIG. 3 is required.

An X-ray mask having such a regular mesh pattern for fabricating intended composite piezo-electric members is formed by electrocasting or interlacing: (step S2 in FIG. 2). This mask 1 has a negative pattern with the intention of making a female mold of PMMA (polymethyl methacrylate) which will be explained later.

Resist material 2 of PMMA is exposed to synchrotron radiation X-rays through the mask 1: (shown by (a) in FIG. 4). Subsequently, the resist material 2 is rendered the development process thereby to make a PMMA female mold 3 shown by (b) in FIG. 4: (step S3 in FIG. 2).

Figure 4:
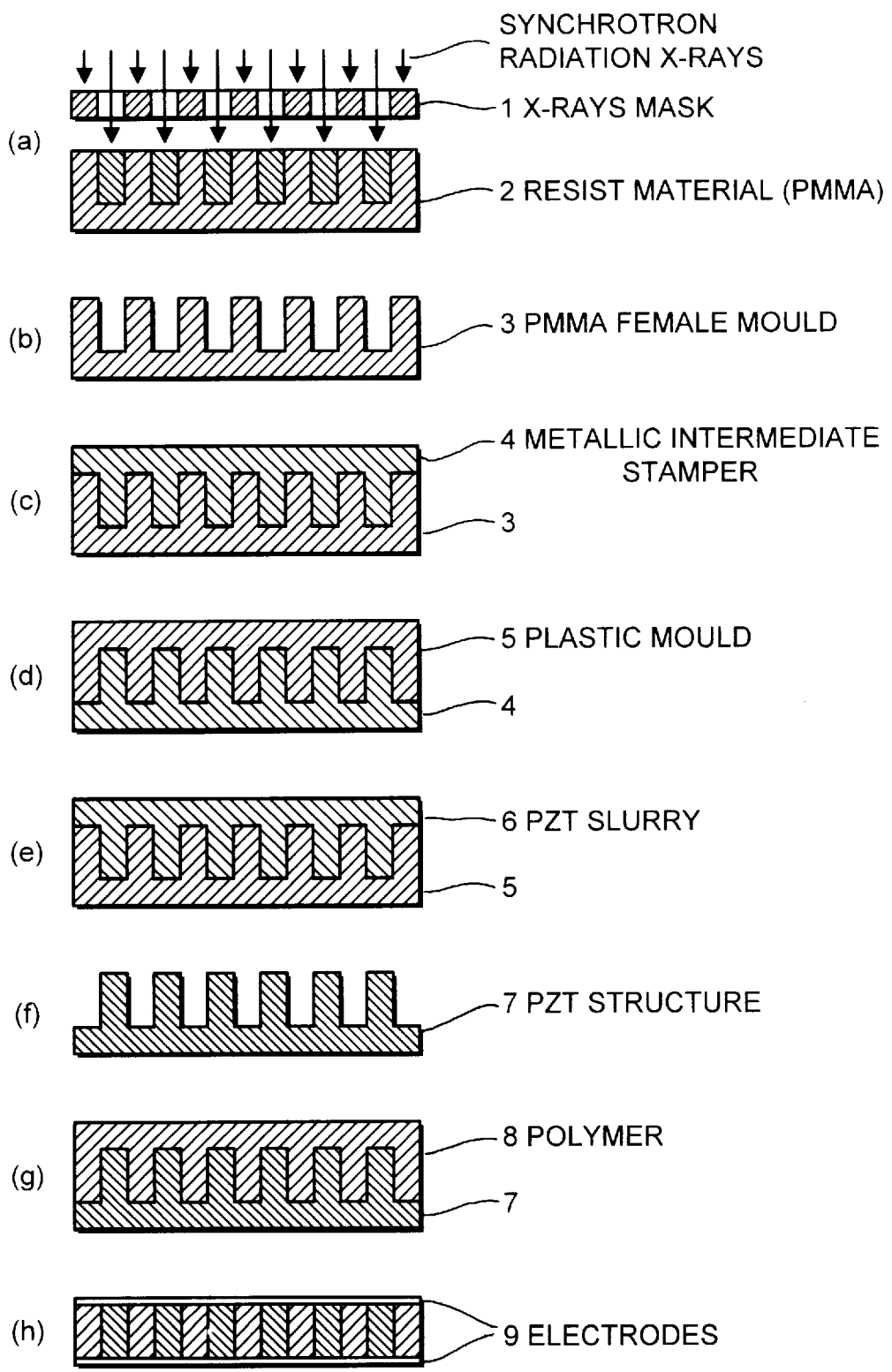
FIG. 4 is a set of diagrams showing the principal steps of composite piezo-electric member fabrication method based on an embodiment of this invention.

The PMMA female mold 3 is used to make an intermediate stamper 4 of metal such as nickel as a mold as shown by (c) in FIG. 4: (step S4 in FIG. 2). The metallic intermediate stamper 4 is used to make a plastic mold 5 shown by (d) in FIG. 4: (step S5 in FIG. 2).

Piezo-electric material 6 of PZT (lead zirconate titanate) slurry is cast into the plastic mold 5 as shown by (e) in FIG. 4, and it is sintered: (steps S6 and S7 in FIG. 2).

The plastic mold 5 is removed (shown by (f) in FIG. 4), the PZT structure 7 is filled with polymer 8 as shown by (g) in FIG. 4, and the PZT-polymer composite is rendered the polishing process: (step S8 in FIG. 2) so that the PZT section 7 is poled: (step S9 in FIG. 2).

Finally, electrodes 9 are formed on the top and bottom of the PZT-polymer composite as shown by (h) in FIG. 4: (step S10 in FIG. 2), it undergoes dicing: (step S11 in FIG. 2), and lead wires are bonded on the electrodes 9: (step S12 in FIG. 2) to complete the intended 1–3 bonding composite piezo-electric members or 3–1 bonding composite piezo-electric members.

Although different processes and materials may be used in the intermediate stages of the foregoing composite piezo-electric member fabrication method, the use of a wire gauze for the mask 1 is crucial.

The inventor's experiment and calculation reveal that the expenditure for the X-ray mask design and manufacturing among the total manufacturing cost of composite piezo-electric members can be reduced to about ⅟1000 of the conventional expenditure.

Another embodiment of composite piezo-electric member fabrication method

1. By machining PZT slurry in a semi-solid state (green sheet or green state) based on the foregoing LIGA process, it is possible to fabricate composite piezoelectric members without using a male and female molds. Although the intensity of synchrotron radiation X-rays and the viscosity of PZT slurry need to be adjusted properly to match with the X-ray absorptive property of PZT, this variant method is suitable for the fabrication of composite piezo-electric members having a large aspect ratio.

This variant method uses an arrayed land pattern instead of a mesh pattern for the X-ray mask, and it can be formed by electrocasting.

Preferred ranges of dimensions of composite piezo-electric members and X-ray mask 1. The LIGA process surpasses the conventional dice-and-fill scheme in the range of rod size and pitch from 20 to 30 μm (about 50 μm at maximum).

2. The wire gauze mask formed by electrocasting for the fabrication of composite piezo-electric members can have a wire pitch as small as 5 to 10 μm and a wire thickness as small as 2 to 3 μm.

3. The LIGA process can accomplish up to about 50 μm of the rod size and pitch of the final product.

4. The process based on the exposure of synchrotron radiation X-rays can stably form up to 400 to 500 μm in terms of the height (thickness) of the final product. Final products in excess of this height cannot be fabricated stably due to different doses of X-rays depending on the depth of resist.

5. Drawing of PZT slurry based on the die-stamp scheme is limited in its dimension up to 300 to 500 μm.

6. As a conclusion of the preferred ranges of dimensions, the X-ray mask has a pitch of mesh of 5 to 50 μm, the final product has a wall thickness and rod size smaller than the pitch of mesh, and a height of 50 μm at maximum.

Many widely different embodiments of the invention may be constructed without departing from the spirit and the scope of the present invention. It should be understood that the present invention is not limited to the specific embodiments described in the specification, except as defined in the appended claims.

What is claimed is:

1. A method of fabricating a composite piezo-electric member comprising the steps of:

provideing an X-ray mask consisting of a metallic wire gauze with a regular pattern of rectangles of dimensions ranging from 5 to 50 μm, and having a thickness of 2 to 3 μm;

placing said mask over a layer of resist material;

exposing said layer of resist material to synchrotron radiation X-rays through said mask and lithography developing said resist material thereby to provide a female mold with a pattern of holes corresponding to the rectangular pattern of said mask where the resist material is exposed to said synchrotron radiation X-rays;

using the resulting female mold to produce a metallic intermediate stamper mold having a protrusion pattern corresponding to the pattern of holes of said female mold;

using said metallic intermediate stamper mold to produce a plastic mold having the same pattern of hole as said female mold;

using said plastic mold to produce a piezo-electric structure having a pattern of holes corresonding to the protrusion pattern of said metallic intermediate stamper mold;

filling the pattern of holes in said piezo-electric structure with a polymer;

cutting the resulting piezo-electric structure filled with polymer to provide two parallel surfaces thereof; and providing electrodes on the parallel surfaces.

2. The method of claim 1, wherein the composite piezo-electric member comprises 1–3 bonding composite piezo-electric members or 3–1 bonding composite piezo-electric members.

3. The method of claim 1, wherein said metallic wire gauze is of platinum, and the dimensions of the rectangles are from 5 to 7 μm.

4. The method of claim 1, wherein said metallic wire gauze is of platinum, and the dimensions of said rectangles are from 5 to 10 μm.

5. The method of claim 1, wherein the metallic wire gauze is prepared by electrocasting.

6. The method of claim 1, wherein the metallic wire gauze is prepared by interlacing.

7. The method of claim 1, wherein the metallic wire gauze is of copper or nickel.

8. The method of claim 1, wherein the metallic intermediate stamper mold is of nickel.

9. The method of claim 1, wherein the resist material is of polymethyl methacrylate.

10. The method of claim 1, wherein the composite piezo-electric member is made by the LIGA process, and the rod size and pitch of a final product is from 20 to 50 μm, and the thickness of the final product is up to 500 μm, and the piezo-electric material used to produce the piezo-electric structure is PZT in slurry form.

11. A mask for fabricating a composite piezo-electric member wherein said mask is disposed over a resist material and exposed to synchrotron radiation X-rays so that a pattern of holes in said mask expose the resist material to the synchrotron radiation X-rays and upon lithography development provide a pattern of corresponding holes therein; wherein said mask consists of a metallic wire gauze having a regular pattern of rectangles of dimensions in the range of 5 to 50 μm, and a thickness of 2 to 3 μm.

12. The mask of claim 11, wherein said metallic wire gauze is of platinum.

13. The mask of claim 11, wherein said mask is made by electrocasting.

14. The mask of claim 11, wherein said mask is made by interlacing.

15. The mask of claim 11, wherein said dimensions are in the range of 5 to 10 μm.

16. The mask of claim 11, wherein said dimensions are in the rage of 5 to 7 μm.

17. The mask of claim 11, wherein the thickness of said mask is between 20 to 25 μm, and the metal used therein is copper or nickel.

* * * * *